(12) United States Patent
Tajima et al.

(10) Patent No.: US 12,159,932 B2
(45) Date of Patent: Dec. 3, 2024

(54) SEMICONDUCTOR DEVICE

(71) Applicant: KABUSHIKI KAISHA TOSHIBA, Tokyo (JP)

(72) Inventors: Jumpei Tajima, Mitaka (JP); Toshiki Hikosaka, Kawasaki (JP); Shinya Nunoue, Ichikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/014,009

(22) Filed: Sep. 8, 2020

(65) Prior Publication Data

US 2021/0184028 A1  Jun. 17, 2021

(30) Foreign Application Priority Data

Dec. 13, 2019 (JP) .................................. 2019-225146

(51) Int. Cl.
*H01L 29/778* (2006.01)
*H01L 29/20* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
None
See application file for complete search history.

(56) References Cited

U.S. PATENT DOCUMENTS 8,860,089 B2    10/2014  Park et al.
8,890,212 B2    11/2014  Jeon et al.
(Continued)

FOREIGN PATENT DOCUMENTS

JP    2011-187643 A    9/2011
JP    2011-238654 A    11/2011
(Continued)

OTHER PUBLICATIONS

Li, W. "Low-leakage-current AlGaN/GaN HEMTs on Si substrates with partially Mg-doped GaN buffer layer by metal organic chemical vapor deposition" Chin. Phys. B vol. 23, No. 3 Jan. 24, 2014 pp. 038403-1 through 038403-5 (Year: 2014).*
(Continued)

*Primary Examiner* — Grant S Withers
(74) *Attorney, Agent, or Firm* — Oblon, McClelland, Maier & Neustadt, L.L.P.

(57) ABSTRACT

According to one embodiment, a semiconductor device includes first, second, and third electrodes, first, second, and third semiconductor layers, and a first insulating member. The first semiconductor layer includes first, second, third, fourth, and fifth partial regions. The third partial region is between the first and second partial regions. The fourth partial region is between the first and third partial regions. The fifth partial region is between the third and second partial regions. The first electrode includes a first electrode portion. The second semiconductor layer includes first and second semiconductor portions. The third semiconductor layer includes first and second semiconductor regions. The second semiconductor region is electrically connected to the first semiconductor region and the first electrode portion. The first insulating member includes a first insulating portion. The first insulating portion is provided between the third partial region and the third electrode.

18 Claims, 8 Drawing Sheets

(51) Int. Cl.
  *H01L 29/205* (2006.01)
  *H01L 29/207* (2006.01)
  *H01L 29/417* (2006.01)
  *H01L 29/45* (2006.01)
(52) U.S. Cl.
  CPC ........ *H01L 29/207* (2013.01); *H01L 29/4175* (2013.01); *H01L 29/452* (2013.01); *H01L 29/7783* (2013.01); *H01L 29/7786* (2013.01)

(56) References Cited

U.S. PATENT DOCUMENTS

| | | | |
|---|---|---|---|
| 9,306,051 | B2 | 4/2016 | Miura et al. |
| 10,249,715 | B2 | 4/2019 | Miyamoto et al. |
| 10,388,779 | B2 | 8/2019 | Nakayama et al. |
| 2016/0260827 | A1 | 9/2016 | Nishimori et al. |
| 2018/0026099 | A1* | 1/2018 | Miyamoto .......... H01L 23/5286 257/77 |

FOREIGN PATENT DOCUMENTS

| | | |
|---|---|---|
| JP | 2012-248632 A | 12/2012 |
| JP | 2014-72528 A | 4/2014 |
| JP | 2015-115582 A | 6/2015 |
| JP | 2015-149392 A | 8/2015 |
| JP | WO 2016/039177 A1 | 3/2016 |
| JP | 2016-163017 A | 9/2016 |
| JP | 2017-157589 A | 9/2017 |
| JP | 2018-18848 A | 2/2018 |

OTHER PUBLICATIONS

Leone, S. "Suppression of Iron Memory Effect in GaN epitaxial Layers" Phys. Status Solidi B 255, Oct. 18, 2017 p. 1700377-1700377 (Year: 2017).*
Li, W. "Low-leakage-current AlGaN/GaN HEMTs on Si substrates with partially Mg-doped GaN buffer layer by metal organic chemical vapor deposition" Chin. Phys. B vol. 23, No. 3 Jan. 24, 2014 pp. 038403-1 through 038403-5 (correct copy attached) (Year: 2014).*
Chou, B-Y "Comparative studies of AlGaN/GaN MOS-HEMTs with stacked gate dielectrics by the mixed thin film growth method" Semicon. Sci. Technol. 28, Jun. 21, 2013 pp. 1-6 (Year: 2013).*
Hua, M. "Normally-Off LPCVD-SiNx/GaN MIS-FET With Crystalline Oxidation Interlayer" IEEE Elec. Dev. Lett. vol. 38, No. 7 published Jun. 23, 2017 pp. 929-932 (Year: 2017).*
Zhou, Q. "High-Performance Enhancement-Mode Al2O3/AlGaN/GaN-on-Si MISFETs With 626 MW/cm2 Figure of Merit" IEEE Trans. on Elec. Dev. vol. 62, No. 3 Mar. 2015 pp. 776-781 (Year: 2015).*

* cited by examiner

SEMICONDUCTOR DEVICE

CROSS-REFERENCE TO RELATED APPLICATIONS

This application is based upon and claims the benefit of priority from Japanese Patent Application No. 2019-225146, filed on Dec. 13, 2019; the entire contents of which are incorporated herein by reference.

FIELD

Embodiments of the invention generally relate to a semiconductor device.

BACKGROUND

For example, stable characteristics of a semiconductor device such as a transistor or the like are desirable.

DETAILED DESCRIPTION

Figure 1:
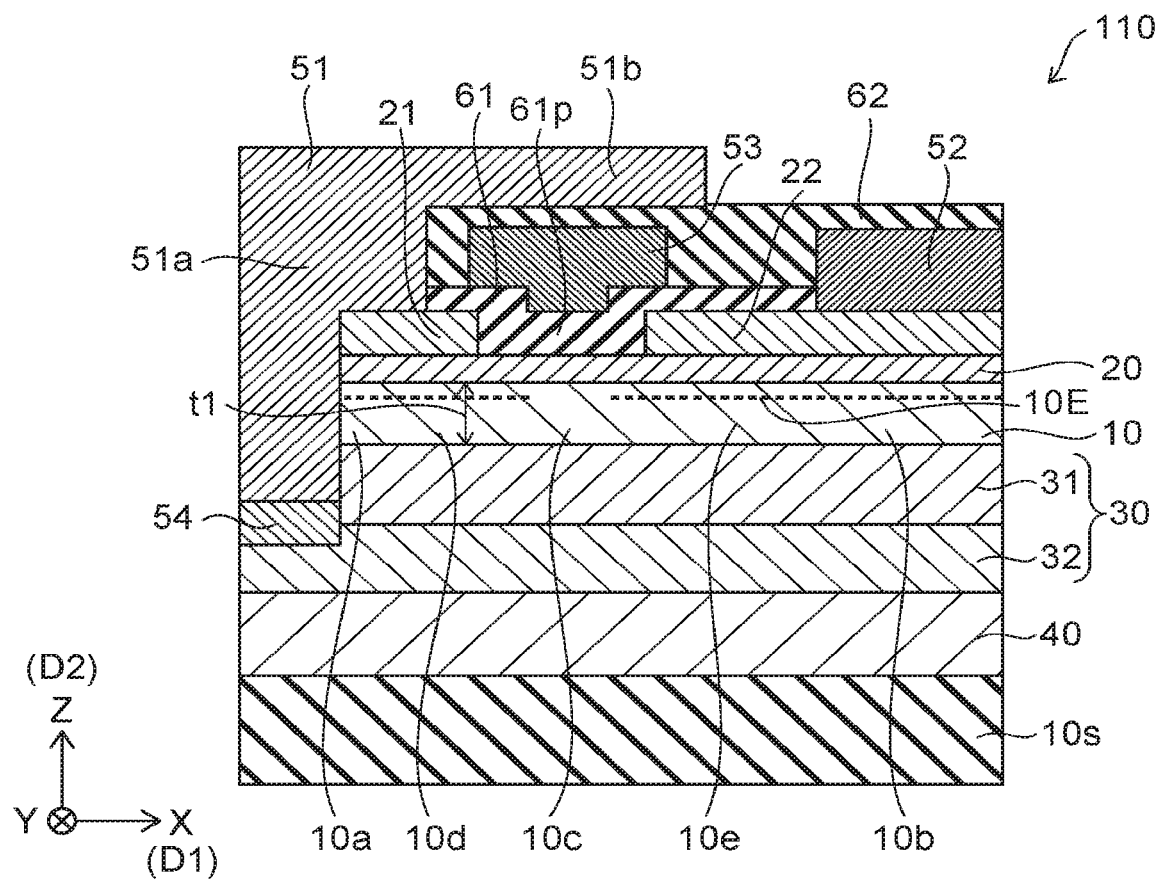
FIG. 1 is a schematic cross-sectional view illustrating a semiconductor device according to a first embodiment.

According to one embodiment, a semiconductor device includes a first electrode, a second electrode, a third electrode, a first semiconductor layer, a second semiconductor layer, a third semiconductor layer, and a first insulating member. The first semiconductor layer includes $Al_{x1}Ga_{1-x1}N$ ($0 \leq x1 < 1$). The first semiconductor layer includes a first partial region, a second partial region, a third partial region, a fourth partial region, and a fifth partial region. A direction from the first partial region toward the second partial region is along a first direction. The third partial region is between the first partial region and the second partial region in the first direction. The fourth partial region is between the first partial region and the third partial region in the first direction. The fifth partial region is between the third partial region and the second partial region in the first direction. The first electrode includes a first electrode portion. A direction from the first electrode portion toward the second electrode is along the first direction. A position in the first direction of the third electrode is between a position in the first direction of the first electrode portion and a position in the first direction of the second electrode. A second direction from the third partial region toward the third electrode crosses the first direction. The second semiconductor layer includes $Al_{x2}Ga_{1-x2}N$ ($0 < x2 \leq 1$ and $x1 < x2$). The second semiconductor layer includes a first semiconductor portion and a second semiconductor portion. A direction from the fourth partial region toward the first semiconductor portion is along the second direction. A direction from the fifth partial region toward the second semiconductor portion is along the second direction. The third semiconductor layer includes magnesium and $Al_{x3}Ga_{1-x3}N$ ($0 \leq x3 < 1$ and $x3 < x2$). The third semiconductor layer includes a first semiconductor region and a second semiconductor region. At least a portion of the first semiconductor layer is between the first semiconductor region and the second semiconductor layer. The second semiconductor region is electrically connected to the first semiconductor region and the first electrode portion. A concentration of magnesium in the first semiconductor region is less than a concentration of magnesium in the second semiconductor region. The first insulating member includes a first insulating portion. The first insulating portion is provided between the third partial region and the third electrode.

According to one embodiment, a semiconductor device includes a first electrode, a second electrode, a third electrode, a first semiconductor layer, a second semiconductor layer, a third semiconductor layer, a fourth semiconductor layer, and a first insulating member. The first semiconductor layer includes $Al_{x1}Ga_{1-x1}N$ ($0 \leq x1 < 1$). The first semiconductor layer includes a first partial region, a second partial region, a third partial region, a fourth partial region, and a fifth partial region. A direction from the first partial region toward the second partial region is along a first direction. The third partial region is between the first partial region and the second partial region in the first direction. The fourth partial region is between the first partial region and the third partial region in the first direction. The fifth partial region is between the third partial region and the second partial region in the first direction. The first electrode includes a first electrode portion. A direction from the first electrode portion toward the second electrode is along the first direction. A position in the first direction of the third electrode is between a position in the first direction of the first electrode portion and a position in the first direction of the second electrode. A second direction from the third partial region toward the third electrode crosses the first direction. The second semiconductor layer includes $Al_{x2}Ga_{1-x2}N$ ($0 < x2 \leq 1$ and $x1 < x2$). The second semiconductor layer includes a first semiconductor portion and a second semiconductor portion. A direction from the fourth partial region toward the first semiconductor portion is along the second direction. A direction from the fifth partial region toward the second semiconductor portion is along the second direction. The third semiconductor layer includes magnesium and $Al_{x3}Ga_{1-x3}N$ ($0 \leq x3 < 1$ and $x3 < x2$). The fourth semiconductor layer includes $Al_{x4}Ga_{1-x4}N$ ($0 < x4 \leq 1$, $x1 < x4$, and $x3 < x4$). The third semiconductor layer is between the fourth semiconductor layer and the second semiconductor layer in the second direction. The first semiconductor layer is between the third semiconductor layer and the second semiconductor layer in the second direction. The fourth semiconductor layer is electrically connected to the first electrode portion. The first insulating member includes a first insulating portion. The first insulating portion is provided between the third partial region and the third electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor layer 10, a second semiconductor layer 20, a third semiconductor layer 30, and a first insulating member 61. In the example, the semiconductor device 110 includes a substrate 10s and a fourth semiconductor layer 40.

The first semiconductor layer 10 includes $Al_{x1}Ga_{1-x1}N$ ($0 \leq x1 < 1$). The composition ratio of Al in the first semiconductor layer 10 is, for example, 0.1 or less. The first semiconductor layer 10 includes, for example, GaN.

The first semiconductor layer 10 includes a first partial region 10a, a second partial region 10b, a third partial region 10c, a fourth partial region 10d, and a fifth partial region 10e. The direction from the first partial region 10a toward the second partial region 10b is along a first direction D1.

The first direction D1 is taken as an X-axis direction. One direction perpendicular to the X-axis direction is taken as a Z-axis direction. A direction perpendicular to the X-axis direction and the Z-axis direction is taken as a Y-axis direction.

The third partial region 10c is between the first partial region 10a and the second partial region 10b in the first direction D1. The fourth partial region 10d is between the first partial region 10a and the third partial region 10c in the first direction D1. The fifth partial region 10e is between the third partial region 10c and the second partial region 10b in the first direction D1.

The first electrode 51 includes a first electrode portion 51a. In the example, the first electrode 51 further includes a second electrode portion 51b. For example, the second electrode portion 51b is continuous with the first electrode portion 51a.

The direction from the first electrode portion 51a toward the second electrode 52 is along the first direction D1 (the X-axis direction).

The position in the first direction D1 of the third electrode 53 is between the position in the first direction D1 of the first electrode portion 51a and the position in the first direction D1 of the second electrode 52.

A second direction D2 from the third partial region 10c toward the third electrode 53 crosses the first direction D1. The second direction D2 is, for example, the Z-axis direction.

The second semiconductor layer 20 includes $Al_{x2}Ga_{1-x2}N$ ($0 < x2 \leq 1$ and $x1 < x2$). The composition ratio of Al in the second semiconductor layer 20 is, for example, not less than 0.15 and not more than 0.5. The second semiconductor layer 20 includes, for example, AlGaN. The second semiconductor layer 20 may include multiple regions having mutually-different Al composition ratios. For example, the multiple regions are arranged in the Z-axis direction. One of the multiple regions may include AlN, and another one of the multiple regions may include AlGaN.

The second semiconductor layer 20 includes a first semiconductor portion 21 and a second semiconductor portion 22. The direction from the fourth partial region 10d toward the first semiconductor portion 21 is along the second direction D2 (e.g., the Z-axis direction). The direction from the fifth partial region 10e toward the second semiconductor portion 22 is along the second direction D2.

The third semiconductor layer 30 includes magnesium (Mg) and $Al_{x3}Ga_{1-x3}N$ ($0 \leq x3 < 1$ and $x3 < x2$). For example, the third semiconductor layer 30 includes p-type GaN. The third semiconductor layer 30 may include p-type AlGaN.

At least a portion of the first semiconductor layer 10 is between the third semiconductor layer 30 and the second semiconductor layer 20. The third semiconductor layer 30 includes a first semiconductor region 31 and a second semiconductor region 32. At least a portion of the first semiconductor layer 10 is between the first semiconductor region 31 and the second semiconductor layer 20 in the second direction D2. In the example, the first semiconductor region 31 is between the second semiconductor region 32 and the first semiconductor layer 10 in the second direction D2.

The second semiconductor region 32 is electrically connected to the first semiconductor region 31 and the first electrode portion 51a. The magnesium concentration in the first semiconductor region 31 is less than the magnesium concentration in the second semiconductor region 32. For example, the first semiconductor region 31 is GaN that has a low Mg concentration. For example, the second semiconductor region 32 is GaN that has a high Mg concentration.

The first insulating member 61 includes a first insulating portion 61p. The first insulating portion 61p is provided between the third partial region 10c and the third electrode 53.

For example, the fourth semiconductor layer 40 is provided on the substrate 10s. In the example, the fourth semiconductor layer 40 is a buffer layer. For example, the fourth semiconductor layer 40 includes multiple nitride semiconductor layers including Al. The second semiconductor region 32 of the third semiconductor layer 30 is provided on the fourth semiconductor layer 40. The first semiconductor region 31 of the third semiconductor layer 30 is provided on the second semiconductor region 32. The first semiconductor layer 10 is provided on the first semiconductor region 31. The second semiconductor layer 20 is provided on the first semiconductor layer 10.

For example, a carrier region 10E is formed in a portion of the first semiconductor layer 10 at the second semiconductor layer 20 side. The carrier region 10E is, for example, a two-dimensional electron gas.

For example, the first electrode 51 functions as a source electrode. For example, the second electrode 52 functions as a drain electrode. For example, the third electrode 53 functions as a gate electrode. For example, the first insulating member 61 functions as a gate insulating film. A current that flows between the first electrode 51 and the second electrode 52 can be controlled by controlling the potential of the third electrode 53. The semiconductor device 110 is, for example, a HEMT (High Electron Mobility Transistor).

For example, the first electrode 51 is electrically connected to the first partial region 10a of the first semiconductor layer 10. For example, the second electrode 52 is electrically connected to the second partial region 10b of the first semiconductor layer 10. For example, the first semiconductor layer 10 corresponds to a channel layer. The second semiconductor layer 20 corresponds to a blocking layer.

In the semiconductor device 110, the third semiconductor layer 30 is provided in addition to the first and second semiconductor layers 10 and 20. The third semiconductor layer 30 is of a p-type. A high threshold voltage is obtained by providing the third semiconductor layer 30. For example, a normally-off operation is obtained.

In the embodiment, the first electrode portion 51a of the first electrode 51 is electrically connected to the second semiconductor region 32 (e.g., GaN having a high Mg concentration). The first electrode 51 is electrically connected to the first semiconductor region 31 via the second semiconductor region 32. For example, the potential of the third semiconductor layer 30 is substantially the potential of the first electrode 51.

In the embodiment, the potential of the third semiconductor layer 30 is stable. For example, the threshold voltage is further stabilized thereby. According to the embodiment, a semiconductor device can be provided in which stable characteristics are obtained. For example, a high threshold voltage is stably obtained.

In the embodiment, the first semiconductor region 31 that has a low Mg concentration is provided between the first semiconductor layer 10 and the second semiconductor region 32 that has a high Mg concentration. A stable Mg concentration profile is obtained.

For example, it was found that when a second GaN layer that does not include Mg is directly grown on a first GaN layer that includes a high concentration of Mg, the Mg is introduced also to the second GaN layer, and an unintentionally high concentration of Mg is included in the second GaN layer. For example, it is considered that this is because Mg remains inside the processing apparatus when forming the first GaN layer, and the remaining Mg is incorporated into the second GaN layer when forming the second GaN layer.

In the embodiment, the first semiconductor region 31 that includes a low concentration of Mg is formed on the second semiconductor region 32 that includes a high concentration of Mg, and the first semiconductor layer 10 is formed on the first semiconductor region 31. Thereby, for example, it was found that the unintentional introduction of Mg into the first semiconductor layer 10 can be suppressed. For example, it was found that Mg is easily incorporated into the second semiconductor region 32 by reducing the partial pressure of ammonia when forming the second semiconductor region 32. On the other hand, it was found that Mg is not easily incorporated into the first semiconductor region 31 when the partial pressure of ammonia is high when forming the first semiconductor region 31. The second semiconductor region 32 that has a high Mg concentration and the first semiconductor region 31 that has a low Mg concentration may be formed by such conditions.

For example, the first semiconductor layer 10 substantially does not include a p-type impurity (e.g., magnesium (Mg)). The concentration of the p-type impurity in the first semiconductor layer 10 is $1\times10^{17}\,\mathrm{cm}^{-3}$ or less. For example, high carrier mobility is obtained by setting the concentration of the p-type impurity to be low.

In the embodiment as described below, the concentration of carbon (C) in the first semiconductor region 31 may be less than the carbon concentration in the first semiconductor layer 10. For example, in a nitride semiconductor that includes Mg, the carbon functions as an n-type impurity. By including carbon in the first semiconductor layer 10, the function of Mg as a p-type impurity is suppressed even when Mg is included in the first semiconductor layer 10 due to diffusion, etc. For example, the conductivity type of the first semiconductor layer 10 is suppressed. More stable characteristics are more easily obtained.

In the embodiment, it is favorable for a length t1 along the second direction (e.g., the Z-axis direction) of the first semiconductor layer 10 (referring to FIG. 1) to be 200 nm or less. Thereby, for example, the threshold voltage can be increased.

As shown in FIG. 1, the first semiconductor region 31 is provided between the second semiconductor region 32 and the first partial region 10a in the second direction D2 (e.g., the Z-axis direction). The first semiconductor region 31 is provided between the second semiconductor region 32 and the fourth partial region 10d in the second direction D2. The first semiconductor region 31 is provided between the second semiconductor region 32 and the third partial region 10c in the second direction D2. The first semiconductor region 31 is provided between the second semiconductor region 32 and the fifth partial region 10e in the second direction D2.

In one example according to the embodiment, the magnesium concentration in the first semiconductor region 31 is, for example, less than $1\times10^{18}\,\mathrm{cm}^{-3}$. The magnesium concentration in the second semiconductor region 32 is $1\times10^{18}\,\mathrm{cm}^{-3}$ or more. In another example, for example, the magnesium concentration in the first semiconductor region 31 is less than $5\times10^{17}\,\mathrm{cm}^{-3}$. For example, the magnesium concentration in the second semiconductor region 32 is $5\times10^{17}\,\mathrm{cm}^{-3}$ or more. The magnesium concentration in the first semiconductor region 31 may be, for example, $1\times10^{17}\,\mathrm{cm}^{-3}$ or more. The magnesium concentration in the second semiconductor region 32 may be, for example, $1\times10^{20}\,\mathrm{cm}^{-3}$ or less.

In the example as shown in FIG. 1, the direction from a portion of the second semiconductor region 32 toward the first electrode portion 51a is along the second direction D2 (e.g., the Z-axis direction).

In the example, the semiconductor device 110 includes a conductive member 54. For example, the conductive member 54 contacts the second semiconductor region 32 and the first electrode portion 51a. The conductive member 54 is provided between the second semiconductor region 32 and the first electrode portion 51a. For example, the conductive member 54 is provided between the first electrode portion 51a and a portion of the second semiconductor region 32 in the second direction D2 (e.g., the Z-axis direction).

The conductive member 54 is, for example, a contact metal. The conductive member 54 includes, for example, at least one selected from the group consisting of Ni, Pd, Ag, and Au.

The first electrode portion 51a includes at least one selected from the group consisting of Ti and Al. For example, a low resistance is obtained.

In the example as described above, the first electrode 51 includes the second electrode portion 51b. The direction from the third electrode 53 toward the second electrode portion 51b is along the second direction D2 (e.g., the Z-axis direction). A second insulating member 62 is provided between the third electrode 53 and the second electrode portion 51b. For example, the position in the first direction D1 (the X-axis direction) of the end portion of the second electrode portion 51b is between the position in the first direction D1 of the third electrode 53 and the position in the first direction D1 of the second electrode 52. For example, the second electrode portion 51b functions as a field plate. Electric field concentration is relaxed by the second electrode portion 51b. For example, the breakdown voltage is increased.

In the embodiment, the substrate 10s includes, for example, silicon. The substrate 10s may include, for example, sapphire, SiC, or GaN. The fourth semiconductor layer 40 (e.g., the buffer layer) includes, for example, AlN. The fourth semiconductor layer 40 may include, for example, a stacked body in which multiple AlGaN layers are stacked. For example, the fourth semiconductor layer 40 may have a superlattice structure in which a GaN layer and an AlN layer are periodically stacked.

Several examples of semiconductor devices according to the embodiment will now be described. Several differences with the semiconductor device 110 will be described.

Figure 2:
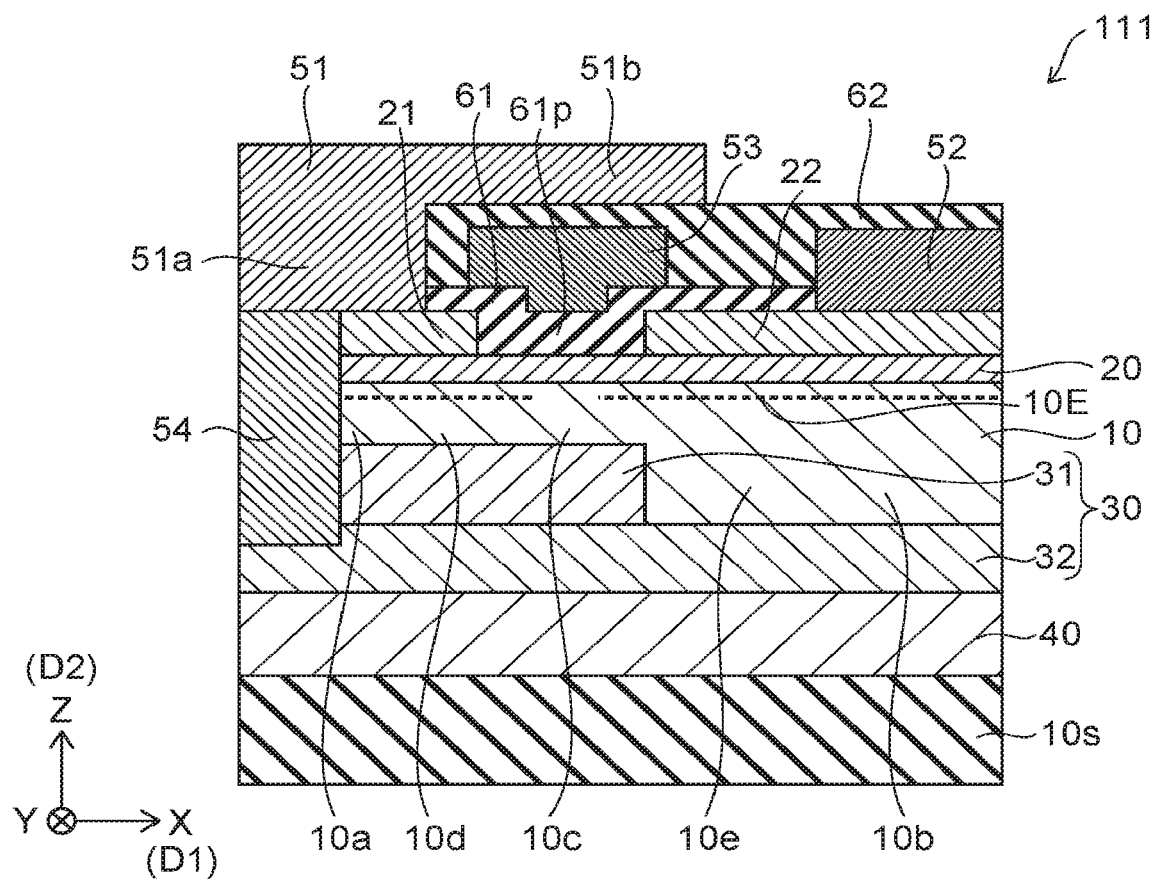
FIG. 2 is a schematic cross-sectional view illustrating a semiconductor device according to the first embodiment.

FIG. 2 is a schematic cross-sectional view illustrating a semiconductor device according to the first embodiment.

In the semiconductor device 111 according to the embodiment as shown in FIG. 2, the first semiconductor region 31 is provided between the second semiconductor region 32 and the first partial region 10a in the second direction D2, between the second semiconductor region 32 and the fourth partial region 10d in the second direction, and between the second semiconductor region 32 and the third partial region 10c in the second direction.

Figure 3:
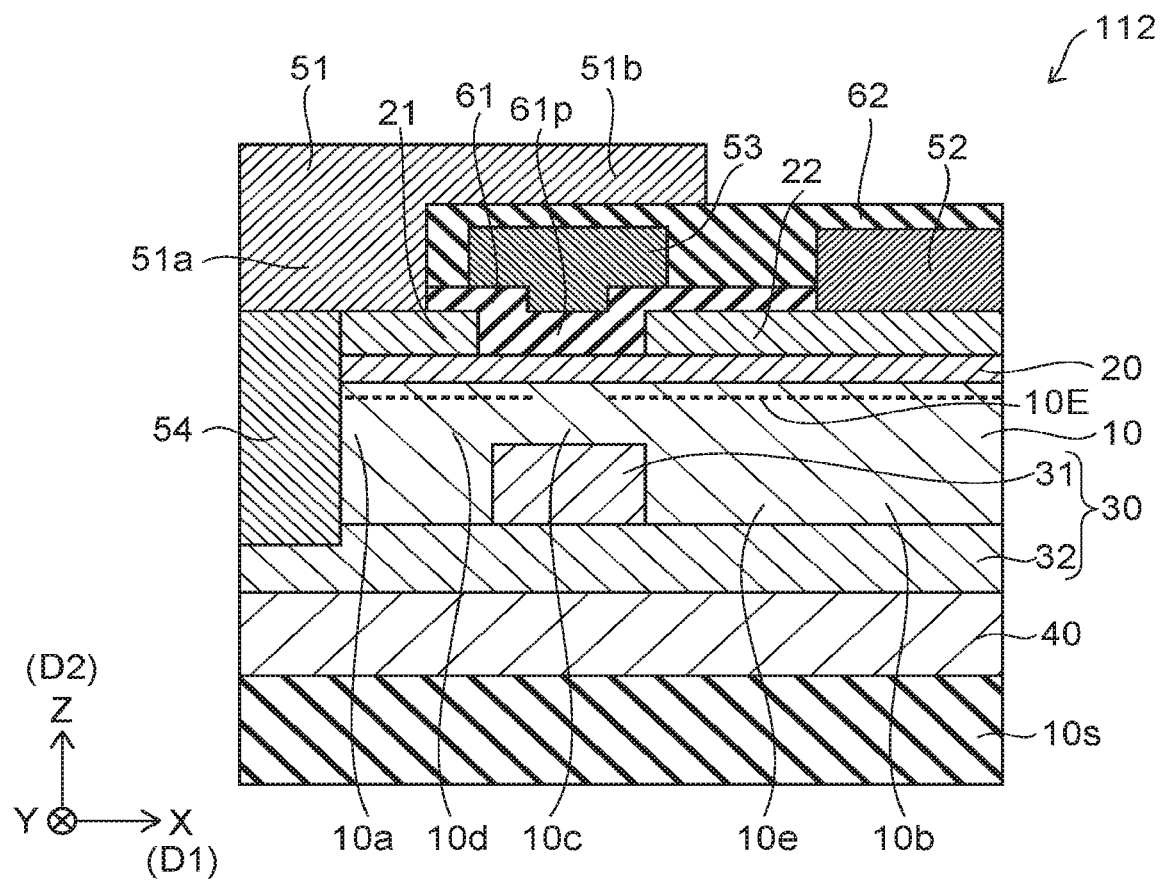
FIG. 3 is a schematic cross-sectional view illustrating a semiconductor device according to the first embodiment.

FIG. 3 is a schematic cross-sectional view illustrating a semiconductor device according to the first embodiment.

In the semiconductor device 112 according to the embodiment as shown in FIG. 3, the first semiconductor region 31 is provided between the second semiconductor region 32 and the third partial region 10c in the second direction (e.g., the Z-axis direction).

Figure 4:
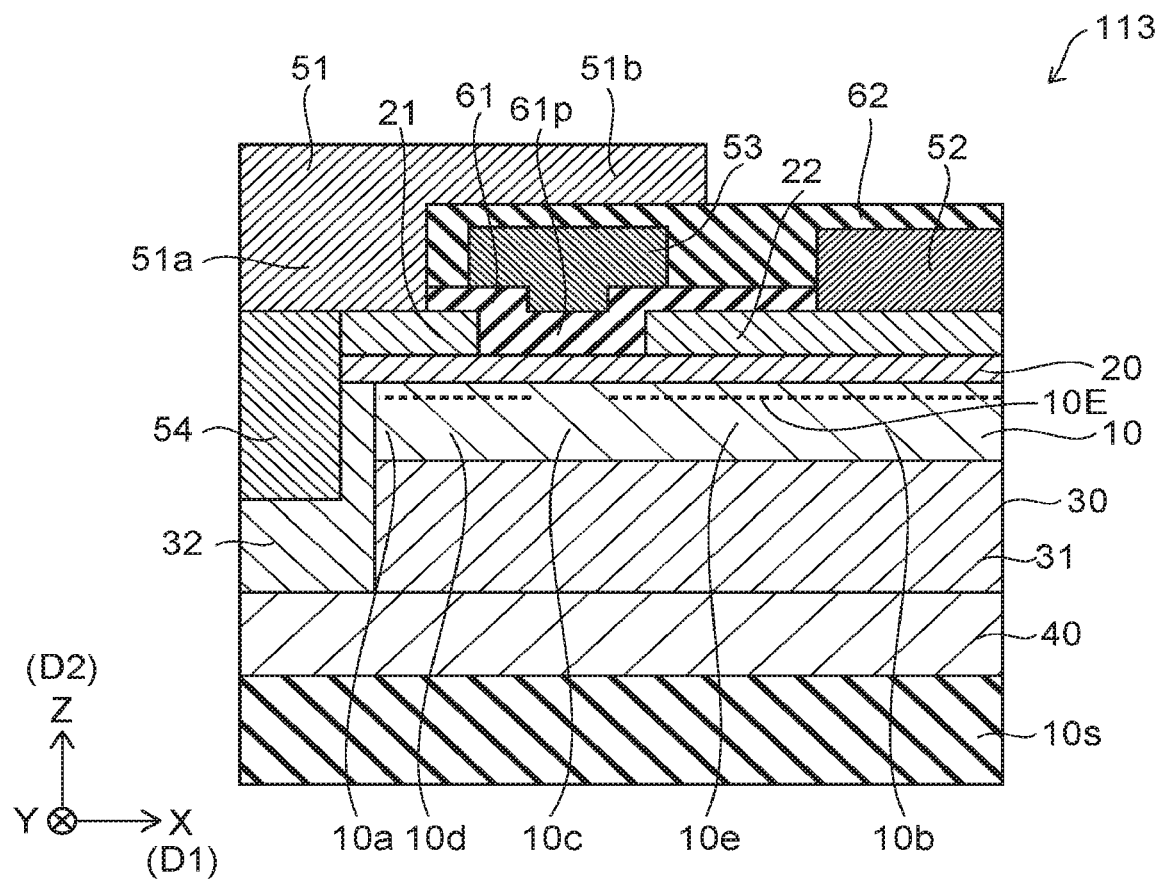
FIG. 4 is a schematic cross-sectional view illustrating a semiconductor device according to the first embodiment.

FIG. 4 is a schematic cross-sectional view illustrating a semiconductor device according to the first embodiment.

In the semiconductor device 113 according to the embodiment as shown in FIG. 4, the direction from at least a portion of the second semiconductor region 32 toward the first semiconductor region 31 is along the first direction (the X-axis direction). In such a case as well, the conductive member 54 contacts the first electrode portion 51a and the second semiconductor region 32.

In the semiconductor devices 111 to 113 as well, stable characteristics are obtained. In the semiconductor device 111, for example, the on-resistance can be reduced. In the semiconductor device 112, for example, the on-resistance can be reduced. In the semiconductor device 113, for example, the threshold voltage can be more stable.

Second Embodiment

Figure 5:
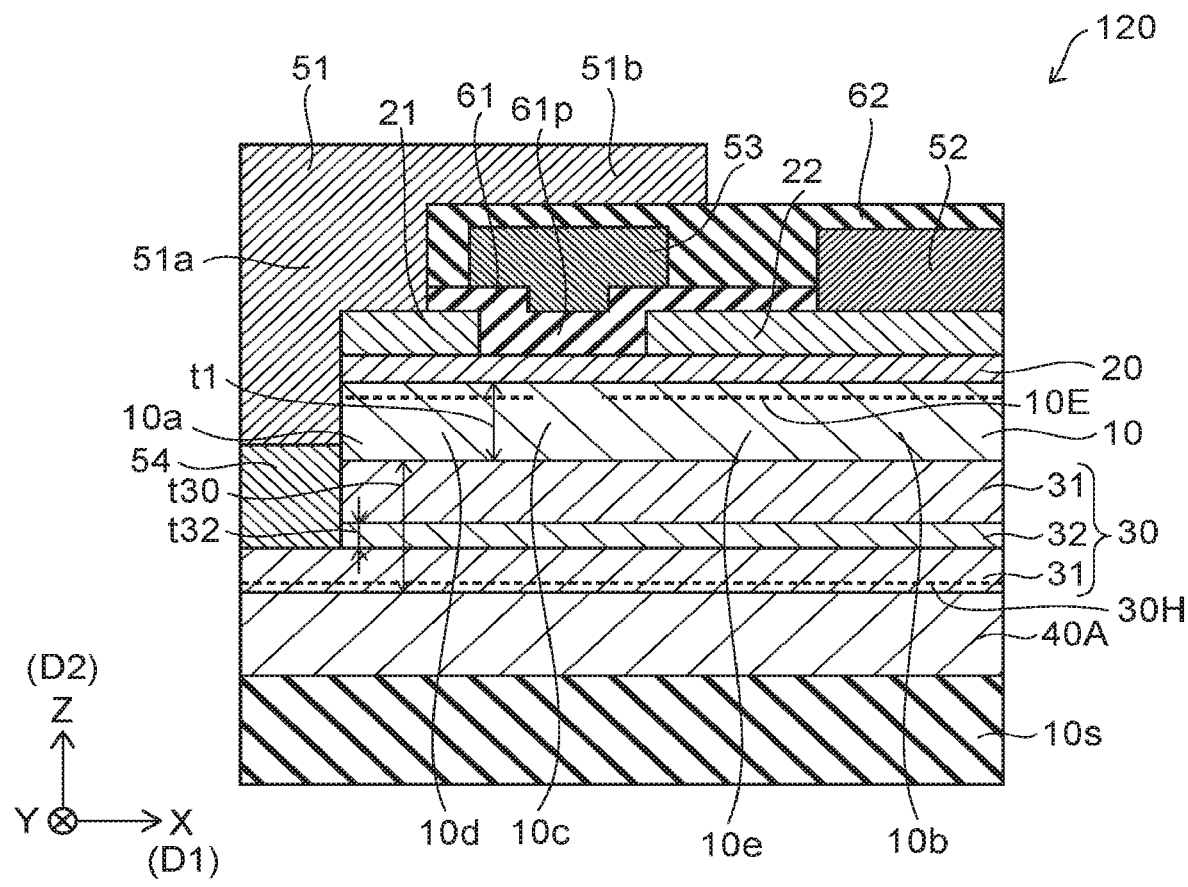
FIG. 5 is a schematic cross-sectional view illustrating a semiconductor device according to a second embodiment.

FIG. 5 is a schematic cross-sectional view illustrating a semiconductor device according to a second embodiment.

As shown in FIG. 5, the semiconductor device 120 according to the embodiment includes the first electrode 51, the second electrode 52, the third electrode 53, the first semiconductor layer 10, the second semiconductor layer 20, the third semiconductor layer 30, a fourth semiconductor layer 40A, and the first insulating member 61. In the example, the semiconductor device 120 includes the substrate 10s. The configurations of the first electrode 51, the second electrode 52, the third electrode 53, the first semiconductor layer 10, the second semiconductor layer 20, and the first insulating member 61 of the semiconductor device 120 may be similar to those of the semiconductor device 110. Examples of the third and fourth semiconductor layers 30 and 40A of the semiconductor device 120 will now be described.

The fourth semiconductor layer 40A includes $Al_{x4}Ga_{1-x4}N$ ($0 < x4 \leq 1$, $x1 < x4$, and $x3 < x4$). The composition ratio of Al in the fourth semiconductor layer 40A is, for example, not less than 0.1 and not more than 0.5. The fourth semiconductor layer 40A is, for example, an AlGaN layer.

The third semiconductor layer 30 is between the fourth semiconductor layer 40A and the second semiconductor layer 20 in the second direction (e.g., the Z-axis direction). The first semiconductor layer 10 is between the third semiconductor layer 30 and the second semiconductor layer 20 in the second direction.

As shown in FIG. 5, the third semiconductor layer 30 includes multiple first semiconductor regions 31. The second semiconductor region 32 is between one of the multiple first semiconductor regions 31 and another one of the multiple first semiconductor regions 31 in the second direction (the Z-axis direction). The magnesium concentration in the multiple first semiconductor regions 31 is less than the magnesium concentration in the second semiconductor region 32.

The second semiconductor region 32 may be a S-doped layer. For example, a length t32 along the second direction (e.g., the Z-axis direction) of the second semiconductor region 32 is not less than $\frac{1}{1000}$ and not more than $\frac{1}{10}$ of a length t30 along the second direction of the third semiconductor layer 30. The length t32 may be, for example, not less than 1 nm and not more than 100 nm.

For example, the second semiconductor region 32 is electrically connected to the first electrode portion 51a. For example, the second semiconductor region 32 is electrically connected to the first electrode portion 51a via the conductive member 54. For example, the potential of the third semiconductor layer 30 is controlled to be the potential of the first electrode portion 51a. The potential of the third semiconductor layer 30 is appropriately controlled. Stable characteristics are obtained thereby.

As shown in FIG. 5, for example, a carrier region 30H may be formed in a portion of the third semiconductor layer 30 at the fourth semiconductor layer 40A side. The carrier region 30H is, for example, a two-dimensional hole gas. The first electrode portion 51a is electrically connected to the carrier region 30H.

The first electrode portion 51a is electrically connected to the third semiconductor layer 30 via at least one of the fourth semiconductor layer 40A or the carrier region 30H. The potential of the third semiconductor layer 30 is controlled to be the potential of the first electrode portion 51a. The potential of the third semiconductor layer 30 is more stably controlled. More stable characteristics are obtained thereby.

The magnesium concentration in the multiple first semiconductor regions 31 is, for example, less than $1 \times 10^{18}$ cm$^{-3}$. The magnesium concentration in the second semiconductor region 32 is, for example, $1 \times 10^{18}$ cm$^{-3}$ or more.

Third Embodiment

Figure 6:
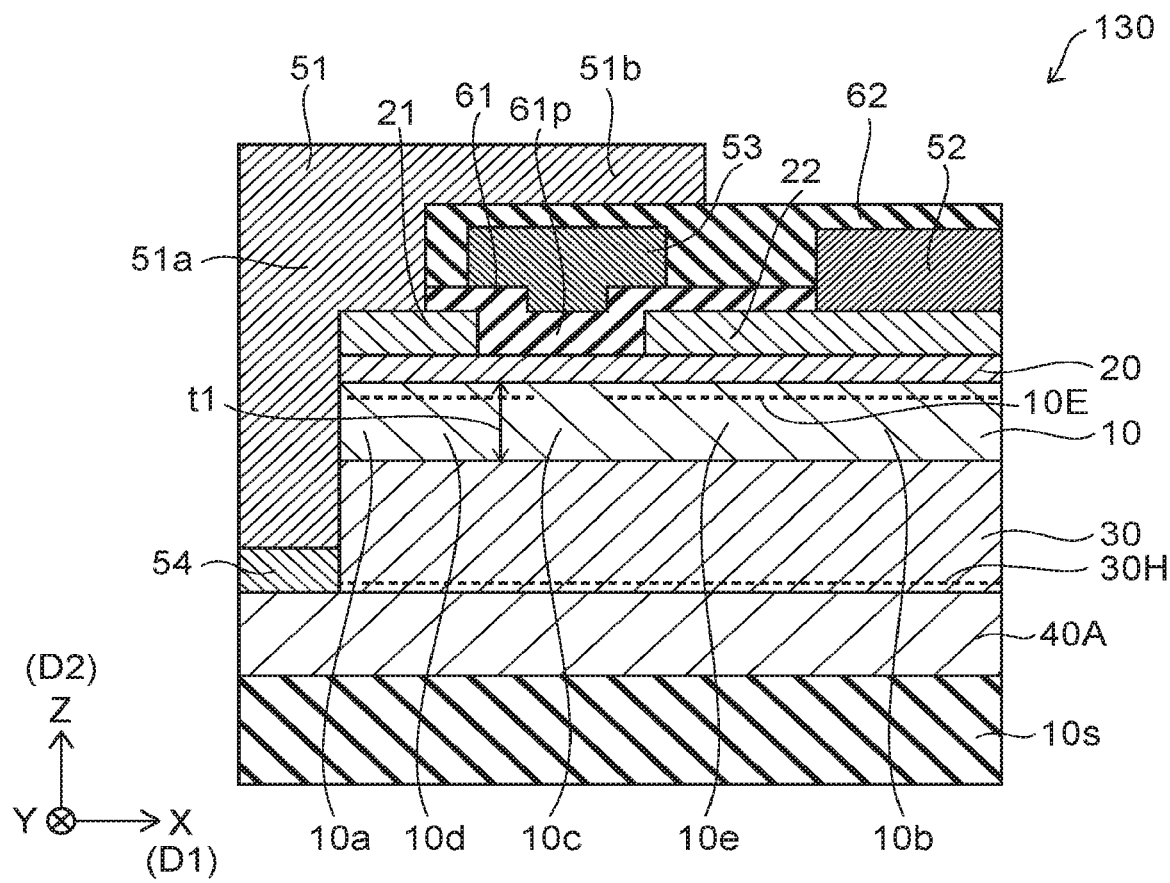
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, the semiconductor device 130 according to the embodiment includes the first electrode 51, the second electrode 52, the third electrode 53, the first semiconductor layer 10, the second semiconductor layer 20, the third semiconductor layer 30, the fourth semiconductor layer 40A, and the first insulating member 61. In the example, the semiconductor device 130 includes the substrate 10s. The configurations of the first electrode 51, the second electrode 52, the third electrode 53, the first semiconductor layer 10, the second semiconductor layer 20, and the first insulating member 61 of the semiconductor device 130 may be similar to those of the semiconductor device 110. Examples of the third and fourth semiconductor layers 30 and 40A of the semiconductor device 130 will now be described.

In the semiconductor device 130, the third semiconductor layer 30 includes magnesium and $Al_{x3}Ga_{1-x3}N$ (0≤x3<1 and x3<x2). The third semiconductor layer 30 includes, for example, p-type GaN.

The fourth semiconductor layer 40A includes $Al_{x4}Ga_{1-x4}N$ (0<x4≤1, x1<x4, and x3<x4). The composition ratio of Al in the fourth semiconductor layer 40A is, for example, not less than 0.1 and not more than 0.5. The fourth semiconductor layer 40A is, for example, an AlGaN layer.

The third semiconductor layer 30 is between the fourth semiconductor layer 40A and the second semiconductor layer 20 in the second direction (e.g., the Z-axis direction). The first semiconductor layer 10 is between the third semiconductor layer 30 and the second semiconductor layer 20 in the second direction (e.g., the Z-axis direction). The fourth semiconductor layer 40A is electrically connected to the first electrode portion 51a.

For example, the carrier region 30H is formed in a portion of the third semiconductor layer 30 at the fourth semiconductor layer 40A side. The carrier region 30H is, for example, a two-dimensional hole gas. The first electrode portion 51a is electrically connected to the carrier region 30H. The first electrode portion 51a is electrically connected to the third semiconductor layer 30 via at least one of the fourth semiconductor layer 40A or the carrier region 30H. The potential of the third semiconductor layer 30 is controlled to be the potential of the first electrode portion 51a.

In the semiconductor device 130 as well, a high threshold voltage is obtained by providing the third semiconductor layer 30. For example, a normally-off characteristic is obtained. By providing the fourth semiconductor layer 40, for example, the potential of the third semiconductor layer 30 is appropriately controlled by the carrier region 30H that is generated. Stable characteristics are obtained thereby.

In the semiconductor device 130 as well, the conductive member 54 is provided. The conductive member 54 is between the first electrode portion 51a and the fourth semiconductor layer 40A. The third semiconductor layer 30 and the fourth semiconductor layer 40 are electrically connected to the first electrode 51 by the conductive member 54.

In the semiconductor devices 110 to 113, 120, and 130 described above, the direction from the first semiconductor portion 21 of the second semiconductor layer 20 toward at least a portion of the first insulating portion 61p is along the first direction (the X-axis direction). For example, a trench is formed by removing a portion of the second semiconductor layer 20. The first insulating member 61 is formed inside the trench. The third electrode 53 is formed in the remaining space. The third electrode 53 is, for example, a trench gate. For example, a high threshold is more easily obtained.

For example, the first insulating portion 61p is between the first semiconductor portion 21 and the second semiconductor portion 22 in the first direction (the X-axis direction). For example, at least a portion of the third electrode 53 may be provided between the first semiconductor portion 21 and the second semiconductor portion 22 in the first direction (the X-axis direction).

Examples of the profile of Mg and the profile of carbon in the semiconductor device 110 will now be described.

Figure 7A:
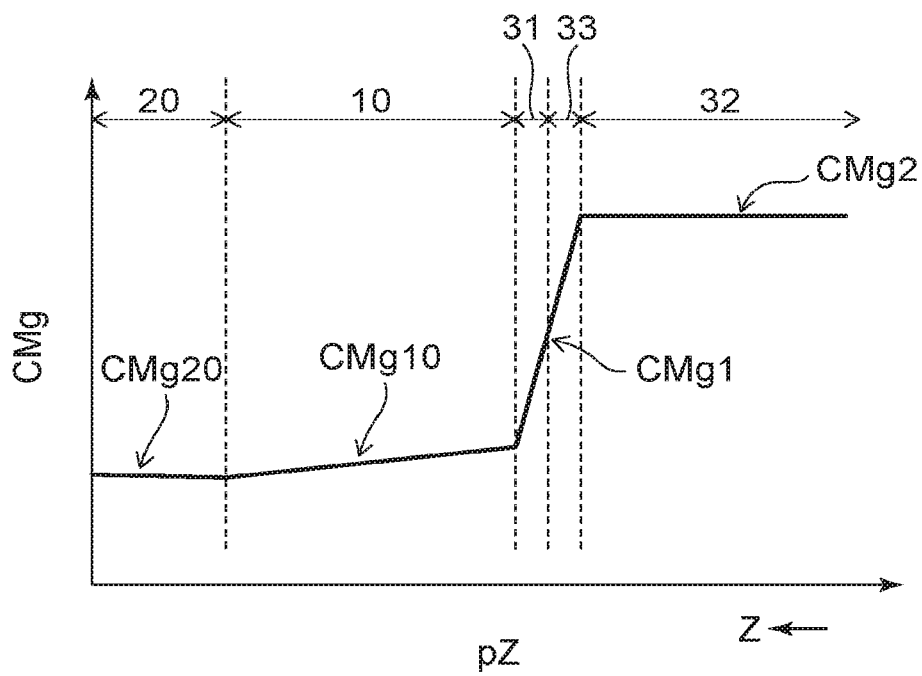
FIGS. 7A and 7B are graphs illustrating the semiconductor device according to the embodiment.
Figure 7B:
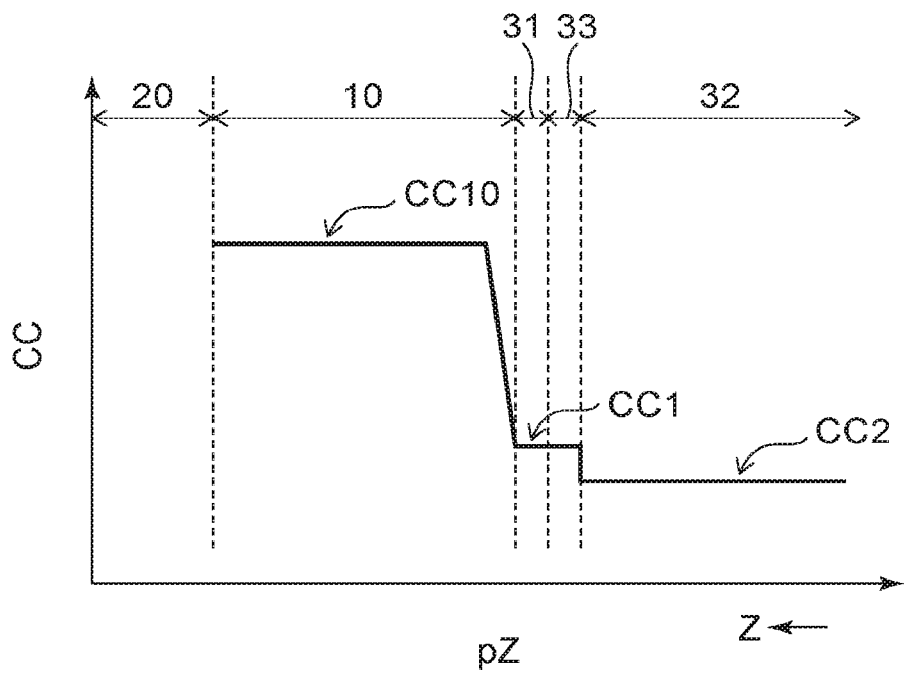

FIGS. 7A and 7B are graphs illustrating the semiconductor device according to the embodiment. FIG. 7A schematically illustrates the concentration profile of Mg in the semiconductor device 110. FIG. 7B schematically illustrates the concentration profile of C (carbon) in the semiconductor device 110. In these figures, the horizontal axis is the position pZ along the Z-axis direction. The vertical axis of FIG. 7A is a Mg concentration CMg (logarithmic). The vertical axis of FIG. 7B is a C concentration CC (logarithmic).

As shown in FIG. 7A, a Mg concentration CMg2 in the second semiconductor region 32 is greater than a Mg concentration CMg1 in the first semiconductor region 31. As shown in FIG. 7A, the Mg concentration CMg may abruptly decrease in a third semiconductor region 33 between the second semiconductor region 32 and the first semiconductor region 31. A Mg concentration CMg10 in the first semiconductor layer 10 and a Mg concentration CMg20 in the second semiconductor layer 20 are less than the Mg concentration CMg1 in the first semiconductor region 31.

As shown in FIG. 7B, a C concentration CC1 in the first semiconductor region 31 is less than a C concentration CC10 in the first semiconductor layer 10. For example, a low concentration CC1 may be obtained in the first semiconductor region 31 by setting the partial pressure of ammonia when forming the first semiconductor region 31 to be greater than the partial pressure of ammonia when forming the second semiconductor region 32. In the example, a C concentration CC2 in the second semiconductor region 32 is not more than the C concentration CC1 in the first semiconductor region 31.

Figure 8A:
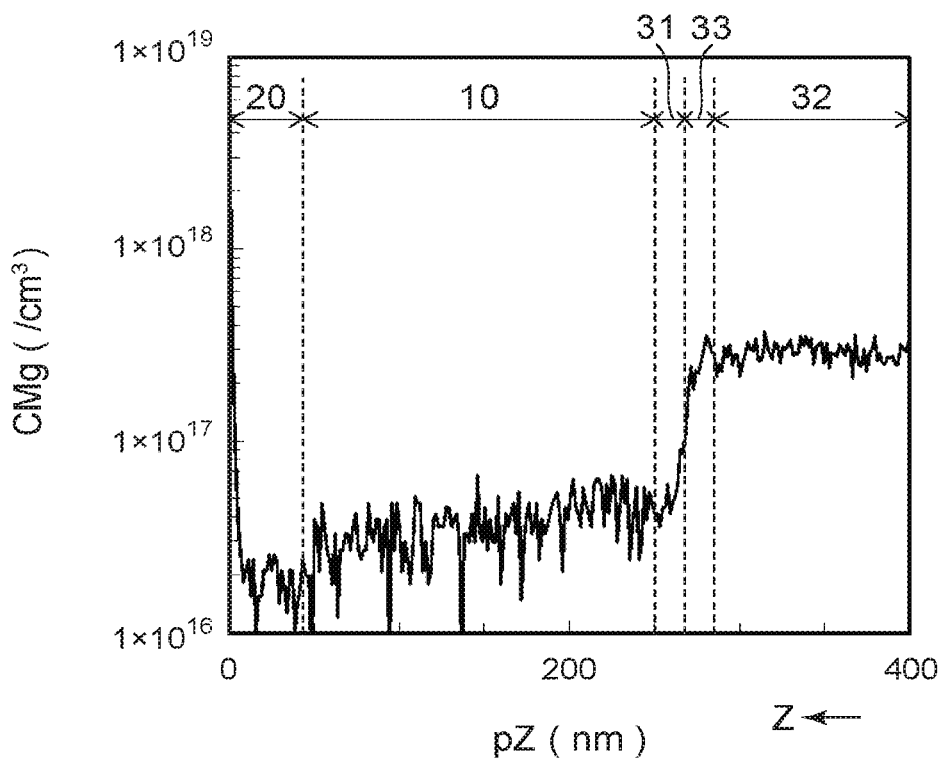
FIGS. 8A and 8B are graphs illustrating the semiconductor device according to the embodiment.
Figure 8B:
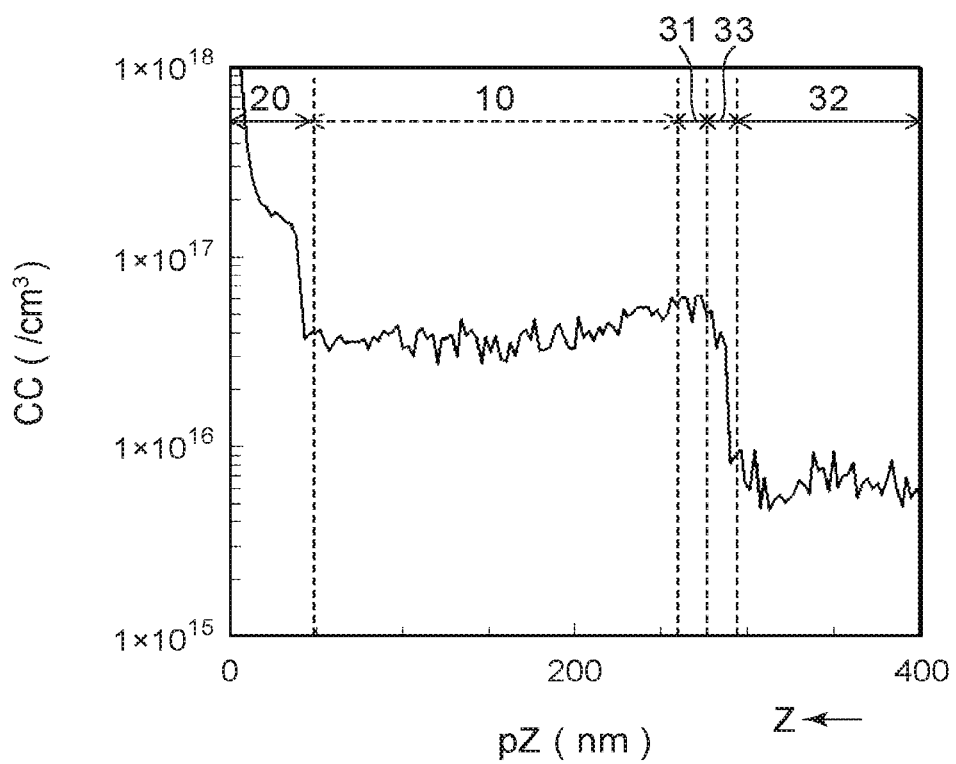

FIGS. 8A and 8B are graphs illustrating the semiconductor device according to the embodiment. These figures illustrate SIMS (Secondary Ion Mass Spectrometry) analysis results of the semiconductor device. In these figures, the horizontal axis is the position pZ along the Z-axis direction. The vertical axis of FIG. 8A is the Mg concentration CMg (logarithmic). The vertical axis of FIG. 8B is the C concentration CC (logarithmic).

As shown in FIG. 8A, the Mg concentration CMg2 in the second semiconductor region 32 is greater than the Mg concentration CMg1 in the first semiconductor region 31. As shown in FIG. 8B, the C concentration CC1 in the first semiconductor region 31 is less than the Mg concentration CC10 in the first semiconductor layer 10.

According to the embodiments, a semiconductor device can be provided in which stable characteristics are obtained.

In the embodiment, "nitride semiconductor" includes all compositions of semiconductors of the chemical formula $B_xIn_yAl_zGa_{1-x-y-z}N$ (0≤x≤1, 0≤y≤1, 0≤z≤1, and x+y+z≤1) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor layer including $Al_{x1}Ga_{1-x1}N$ ($0 \leq x1 < 1$), the first semiconductor layer including a first partial region, a second partial region, a third partial region, a fourth partial region, and a fifth partial region, a direction from the first partial region toward the second partial region being along a first direction, the third partial region being between the first partial region and the second partial region in the first direction, the fourth partial region being between the first partial region and the third partial region in the first direction, the fifth partial region being between the third partial region and the second partial region in the first direction;
   a first electrode including a first electrode portion;
   a second electrode, a direction from the first electrode portion toward the second electrode being along the first direction;
   a third electrode, a position in the first direction of the third electrode being between a position in the first direction of the first electrode portion and a position in the first direction of the second electrode, a second direction from the third partial region toward the third electrode crossing the first direction;
   a second semiconductor layer including $Al_{x2}Ga_{1-x2}N$ ($0 < x2 \leq 1$ and $x1 < x2$), the second semiconductor layer including a first semiconductor sublayer and a second semiconductor sublayer, wherein the first semiconductor sublayer is provided on a top surface of the second semiconductor sublayer in the second direction, wherein the first and second semiconductor sublayers have mutually different Al composition ratios;
   a third semiconductor layer including magnesium and $Al_{x3}Ga_{1-x3}N$ ($0 \leq x3 < 1$ and $x3 < x2$), the third semiconductor layer including a first semiconductor region and a second semiconductor region, at least a portion of the first semiconductor layer being between the first semiconductor region and the second semiconductor layer, the second semiconductor region being electrically connected to the first semiconductor region and the first electrode portion, a concentration of magnesium in the first semiconductor region being less than a concentration of magnesium in the second semiconductor region; and
   a first insulating layer including a first insulating portion, the first insulating portion being provided between the third partial region and the third electrode and having a bottom surface,
   wherein the first electrode is electrically connected with the first partial region,
   wherein a part of the second semiconductor sublayer is provided between the third partial region and a particular portion of the bottom surface of the first insulating portion that is closest to the first semiconductor layer in the second direction so that no portion of the first insulating layer is in physical contact with the first semiconductor layer,
   wherein the first insulating layer physically contacts the first and second semiconductor sublayers,
   wherein the second semiconductor sublayer is formed directly on and physically contacts an entire top surface, which faces the first insulating layer, of the first semiconductor layer, and
   wherein no other layers, other than the second semiconductor sublayer, are formed directly on any part of the top surface of the first semiconductor layer.

2. The device according to claim 1, wherein a direction from a portion of the second semiconductor region toward the first electrode portion is along the second direction.

3. The device according to claim 2, further comprising:
   a conductive member provided between the second semiconductor region and the first electrode portion,
   the conductive member being between the first electrode portion and the portion of the second semiconductor region in the second direction.

4. The device according to claim 3, wherein the first electrode portion includes at least one selected from the group consisting of Ti and Al.

5. The device according to claim 3, wherein the conductive member contacts the first electrode portion and the second semiconductor region.

6. The device according to claim 1, further comprising:
   a conductive member provided between the second semiconductor region and the first electrode portion,
   the conductive member including at least one selected from the group consisting of Ni, Pd, Ag, and Au.

7. The device according to claim 1, wherein a concentration of carbon in the first semiconductor region is less than a concentration of carbon in the first semiconductor layer.

8. The device according to claim 1, wherein the first semiconductor region is provided between the second semiconductor region and the first partial region in the second direction, between the second semiconductor region and the fourth partial region in the second direction, between the second semiconductor region and the third partial region in the second direction, and between the second semiconductor region and the fifth partial region in the second direction.

9. The device according to claim 1, wherein the first semiconductor region is provided between the second semiconductor region and the first partial region in the second direction, between the second semiconductor region and the fourth partial region in the second direction, and between the second semiconductor region and the third partial region in the second direction.

10. The device according to claim 1, wherein the first semiconductor region is provided between the second semiconductor region and the third partial region in the second direction.

11. The device according to claim 1, wherein the first semiconductor region is between the second semiconductor region and the first semiconductor layer in the second direction.

12. The device according to claim 1, wherein a direction from at least a portion of the second semiconductor region toward the first semiconductor region is along the first direction.

13. The device according to claim 1, wherein the concentration of magnesium in the first semiconductor region is less than $1 \times 10^{18}$ cm$^{-3}$, and the concentration of magnesium in the second semiconductor region is $1 \times 10^{18}$ cm$^{-3}$ or more.

14. The device according to claim 13, wherein the concentration of magnesium in the first semiconductor region is less than $5 \times 10^{17}$ cm$^{-3}$, and the concentration of magnesium in the second semiconductor region is $5 \times 10^{17}$ cm$^{-3}$ or more.

15. The device according to claim 1, wherein a length along the second direction of the first semiconductor layer is 200 nm or less.

16. The device according to claim 1, further comprising:

a fourth semiconductor layer including $Al_{x4}Ga_{1-x4}N$ ($0<x4\leq1$, $x1<x4$, and $x3<x4$), the third semiconductor layer being between the fourth semiconductor layer and the second semiconductor layer in the second direction, the first semiconductor layer being between the third semiconductor layer and the second semiconductor layer in the second direction, the third semiconductor layer including a plurality of the first semiconductor regions, the second semiconductor region being between one of the plurality of first semiconductor regions and an other one of the plurality of first semiconductor regions in the second direction, and concentrations of magnesium in the plurality of first semiconductor regions being less than the concentration of magnesium in the second semiconductor region.

17. The device according to claim 16, wherein a length along the second direction of the second semiconductor region is not less than 1/1000 and not more than 1/10 of a length along the second direction of the third semiconductor layer.

18. The device according to claim 16, wherein the concentrations of magnesium in the plurality of first semiconductor regions are less than $1 \times 10^{18}$ cm$^{-3}$, and the concentration of magnesium in the second semiconductor region is $1 \times 10^{18}$ cm$^{-3}$ or more.

* * * * *